(12) United States Patent
Ragossnig et al.

(10) Patent No.: US 7,358,655 B2
(45) Date of Patent: Apr. 15, 2008

(54) ELECTRICAL MULTILAYERED COMPONENT AND LAYER STACK

(75) Inventors: Heinz Ragossnig, Friesach (AT); Sigrid Ragossnig, Friesach (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 10/546,628

(22) PCT Filed: Feb. 19, 2004

(86) PCT No.: PCT/DE2004/000313

§ 371 (c)(1),
(2), (4) Date: Apr. 19, 2006

(87) PCT Pub. No.: WO2004/077583

PCT Pub. Date: Sep. 10, 2004

(65) Prior Publication Data

US 2006/0238073 A1    Oct. 26, 2006

(30) Foreign Application Priority Data

Feb. 24, 2003 (DE) ................. 103 07 825

(51) Int. Cl.
*H01L 41/083* (2006.01)
*H01L 41/187* (2006.01)
(52) U.S. Cl. .................... 310/358; 310/328
(58) Field of Classification Search ........... 310/328, 310/358
See application file for complete search history.

(56) References Cited

U.S. PATENT DOCUMENTS

| | | | |
|---|---|---|---|
| 4,932,119 A * | 6/1990 | Ealey et al. ............ | 29/593 |
| 5,089,739 A * | 2/1992 | Takahashi et al. ...... | 310/328 |
| 5,200,373 A | 4/1993 | Yasutomi et al. | |
| 5,237,239 A * | 8/1993 | Inoue et al. ............. | 310/328 |
| 5,835,338 A | 11/1998 | Suzuki et al. | |
| 6,208,026 B1 | 3/2001 | Bindig et al. | |
| 6,765,337 B1 | 7/2004 | Heinz et al. | |
| 6,798,123 B2 | 9/2004 | Bindig et al. | |
| 2002/0017832 A1* | 2/2002 | Murai et al. ............ | 310/328 |
| 2006/0055288 A1* | 3/2006 | Heinzmann et al. ..... | 310/364 |
| 2006/0066178 A1* | 3/2006 | Lindner et al. ......... | 310/328 |

FOREIGN PATENT DOCUMENTS

| | | |
|---|---|---|
| DE | 68918473 | 3/1989 |
| DE | 4029972 | 9/1990 |
| DE | 19648545 | 11/1996 |

(Continued)

OTHER PUBLICATIONS

German Examination Report, dated Nov. 26, 2003, including translation, 6 pages.

*Primary Examiner*—Thomas M. Dougherty
(74) *Attorney, Agent, or Firm*—Fish & Richardson P.C.

(57) ABSTRACT

A multilayer electrical component includes a plurality of ceramic layers disposed along an axis, a plurality of electrode layers disposed between the plurality of ceramic layers and in electrical contact with the ceramic layers, and a ceramic breach layer disposed between a first and a second ceramic layer of the plurality of ceramic layers along the axis. The ceramic breach layer has a lower breach stability than the plurality of ceramic layers with regard to tensile stresses in the direction of the axis.

10 Claims, 2 Drawing Sheets

FOREIGN PATENT DOCUMENTS

| | | |
|---|---|---|
| DE | 19704389 | 2/1997 |
| DE | 19709690 | 3/1997 |
| DE | 19709691 | 3/1997 |
| DE | 19735649 | 8/1997 |
| DE | 19802302 | 1/1998 |
| DE | 19643148 | 4/1998 |
| DE | 19928178 | 6/1999 |
| DE | 10016428 | 4/2000 |
| DE | 102 34 787 | 10/2003 |
| EP | 1204152 | 11/2001 |
| JP | 02155211 | 6/1990 |
| JP | 06-181343 | * 6/1994 |
| JP | 11-163428 | * 6/1999 |
| JP | 2003-324223 | * 11/2003 |
| JP | 2005-340540 | * 8/2005 |
| WO | WO 03/105246 | 5/2003 |

* cited by examiner

ELECTRICAL MULTILAYERED COMPONENT AND LAYER STACK

TECHNICAL FIELD

The invention relates to a multilayer electrical component with superposed ceramic layers and interposed electrode layers. The invention further relates to a layer stack.

BACKGROUND

Piezoactuators are known in which piezoceramic layers are arranged one on top of another, in a stack. Internal electrodes are arranged between the ceramic layers. When an external voltage is applied to each of two opposingly arranged electrode layers, the resulting electrical field is capable of causing a slight deflection in the ceramic layer due to the piezoelectric effect. The effect of these deflections of the ceramic layers placed on top of each other is cumulative in the lengthwise direction.

In order to be able to assure external contacting of the internal electrodes in piezoactuators by simple means, a passive zone is usually provided at the edge of the piezoactuator, in which only internal electrodes assigned to the same electrical pole lie on top of each other. At this point, the internal electrodes assigned to the opposite electrical pole do not extend quite as far as the edge of the actuator, they are limited to an area inside the actuator. Unlike the active zone, i.e. the zone where electrode layers of opposite polarity are arranged on top of each other, almost no extension of the piezolectrical layers takes place in the passive zone when an electrical voltage is applied, which causes tensile stress of the passive zone in the edge area of the passive zone, caused by the active zone. The more piezoelectric layers are arranged on top of each other, and the greater the applied electrical voltage is, the greater are the tensile stresses that occur at the edge of the passive zone.

These tensile stresses may cause cracking in the edge zone of the piezoactuators, either while the piezoactuator is operating, or even earlier during polarizing, i.e. in the first process step for operating the piezoactuator, in which an electrical polarization is created in the piezolectric layers. When the piezoactuator is operated continuously, these cracks may extend into the interior of the actuator and may break through one or more internal electrodes in the active zone. This may then cause dielectric breach at these breakage points, with slag formation and possibly even an internal short circuit in the component. Steps are taken to avoid such cracks in the internal electrodes.

In order to avoid such cracks, it is known from Patent No. 199 28 178 A1 to divide the piezoactuator into several partial actuators, wherein the partial actuators are stacked on top of each other following their manufacture and affixed by bonding. In this way, tensile loads at the inner edge of the passive zone cannot accumulate over the entire height of the piezoactuator. Instead only the tensile stresses that are created within the partial actuator are significant. However, these are relatively small, since the partial actuator only includes a very small number of superposed piezoelectric layers.

The drawback of the method described in that document is that the geometrical precision when placing individual actuators on top of each other is highly inadequate. In addition, stacking several partial actuators entails an additional manufacturing step, which leads to higher costs.

In order to prevent the formation of cracks in the internal electrodes of piezoactuators, it is also known from German Patent No. DE 198 02 302 to distribute the passive zone over the entire periphery of the piezoactuator with a construction method in which ach component is rotated through 90°. However, this construction has the disadvantage that the external contacting is complicated thereby, since the piezoactuator must be contacted from all four external sides.

From German Patent No. DE 100 16 428 A1, it is further known to balance the stress at the respective point of the passive zone via additionally applied insulating layers in the passive zone. The disadvantage of this construction is that it manufacturing such a piezoactuator is more expensive.

SUMMARY

The object of the present invention is therefore to suggest an electrical multilayer component in which the danger of cracks formation in the internal electrodes may be reduced by simple means.

This problem is solved by an electrical multilayer component according to claim 1. Advantageous embodiments of the multilayer component and a layer stack will be apparent from the dependent claims.

A multilayer electrical component is provided that includes a plurality of superposed ceramic layers. The ceramic layers are arranged along a lengthwise axis. Electrode layers are arranged between the ceramic layers. In addition, a designed ceramic breach layer is arranged at least at one point in the lengthwise direction between the ceramic layers. Said designed breach layer is less stable than the ceramic layers to tensile stresses in the lengthwise direction.

The advantage of this multilayer component is that cracks formation in the component perpendicularly to the lengthwise direction tend to be directed in the designed breach layer, since stability with regard to tensile voltages is at its lowest here. In this way, cracks may be controlled so that they are propagated along the designed breach layers, thus at the same assuring an effective reduction of cracking in the electrode layers.

In one embodiment of the component, the reduced stability of the designed breach layers is achieved in that they are more porous than the ceramic layers.

The component is preferably manufactured by sintering a stack of superposed ceramic green films and electrode layers arranged therebetween. This creates a monolithic component that is easy and inexpensive to produce and which has sufficient mechanical stability for the subsequent processing steps.

In order to further reduce the load on the component due to tensile stresses extending lengthwise, it may be provided for the design to include designed breach layers at multiple points in the lengthwise direction. In this way, the component is subdivided in certain manner into subcomponents along the designed breach layers, wherein each subcomponent may be considered a separate element with regard to loading due to tensile stresses. The cumulative effect of tensile stresses over the entire length of the component, and therewith uncontrolled cracking in the component may thus be prevented.

Porous layers in a ceramic multilayer component represent a potential weak point, particularly with regard to liquids and gases that penetrate into the component from the outside through the pores. It is therefore advantageous if the designed breach layers are for the most part not exposed to electrical fields during operation of the component, to avoid undesirable migration effects. This is achieved if the electrode layers directly adjacent an designed breach layer are allocated to the same polarity in the component. In this way, no significant electrical fields are created across the setpoint breach layer.

In one embodiment of the component, the porosity of the designed breach layers is increased by a factor between 1.2 and 3 relative to the ceramic layers. This porosity value refers to the following method for measuring porosity:

The component is viewed in a longitudinal microsection. Pores, which may occur in the ceramic layers as well as the designed breach layers, are distinguished by a coloured or light-dark contrast with the surrounding ceramic material. Then a unit area is used to determine the proportion of the surface that is made up of pores for each type of layer, the ceramic layer and the designed breach layer. The quotient of the two proportions of pores yields the increased porosity factor.

Porosity may also be expressed as a fraction of theoretical density. In this case, the ceramic layers would have a density equal to 97-98% of the theoretical density, and the designed breach layers would have a density of 90-95% of the theoretical density.

It is also advantageous if the designed breach layers are made from the same ceramic material as the ceramic layers. This enables the number of different materials used in the component to be advantageously minimized. As a positive side-effect of that the subsequent processes for manufacturing the component, such as removing the binder and sintering may be carried out more easily.

Moreover, it is particularly advantageous if the multilayer electrical component is a piezoelectric actuator. The present invention may be implemented to particularly advantageous effect in the case of a piezoelectric actuator, because a piezoelectric actuator generates tensile stresses along a boundary surface between an active and a passive zone when it is in operation, which stresses may be directed in controlled manner towards the interior of the actuator via designed breach layers, so that cracking of the internal electrodes may be avoided.

A layer stack is also provided that is suitable for producing the multilayer component described here. Such a layer stack includes superposed ceramic green films that contain a ceramic powder and an organic bonding agent. At least one of the green films has an increased volumetric content of binding agent with respect to the other green films.

The advantage of such a layer stack is that the higher volumetric content of bonding agent in one or more green films enables ceramic layers with greater porosity to be produced. The bonding agent is removed in a decarbonising process before sintering, and pores may then be formed at the points in the layers that previously included the high proportion of bonding agent.

In this context, it is particularly advantageous if the volumetric content of bonding agent is increased by a factor between 1.5 and 3. This reduces the risk that too little ceramic powder will be present in the ceramic layer, whereas instead of a monolithic component, a component that has already been divided into individual subcomponents before its electrical operation is produced after sintering.

In the following, the invention will be explained in greater detail with reference to an embodiment and the associated drawing.

In the drawing:

DECRIPTION OF THE DRAWINGS

DETAILED DESCRIPTION

Figure 1:
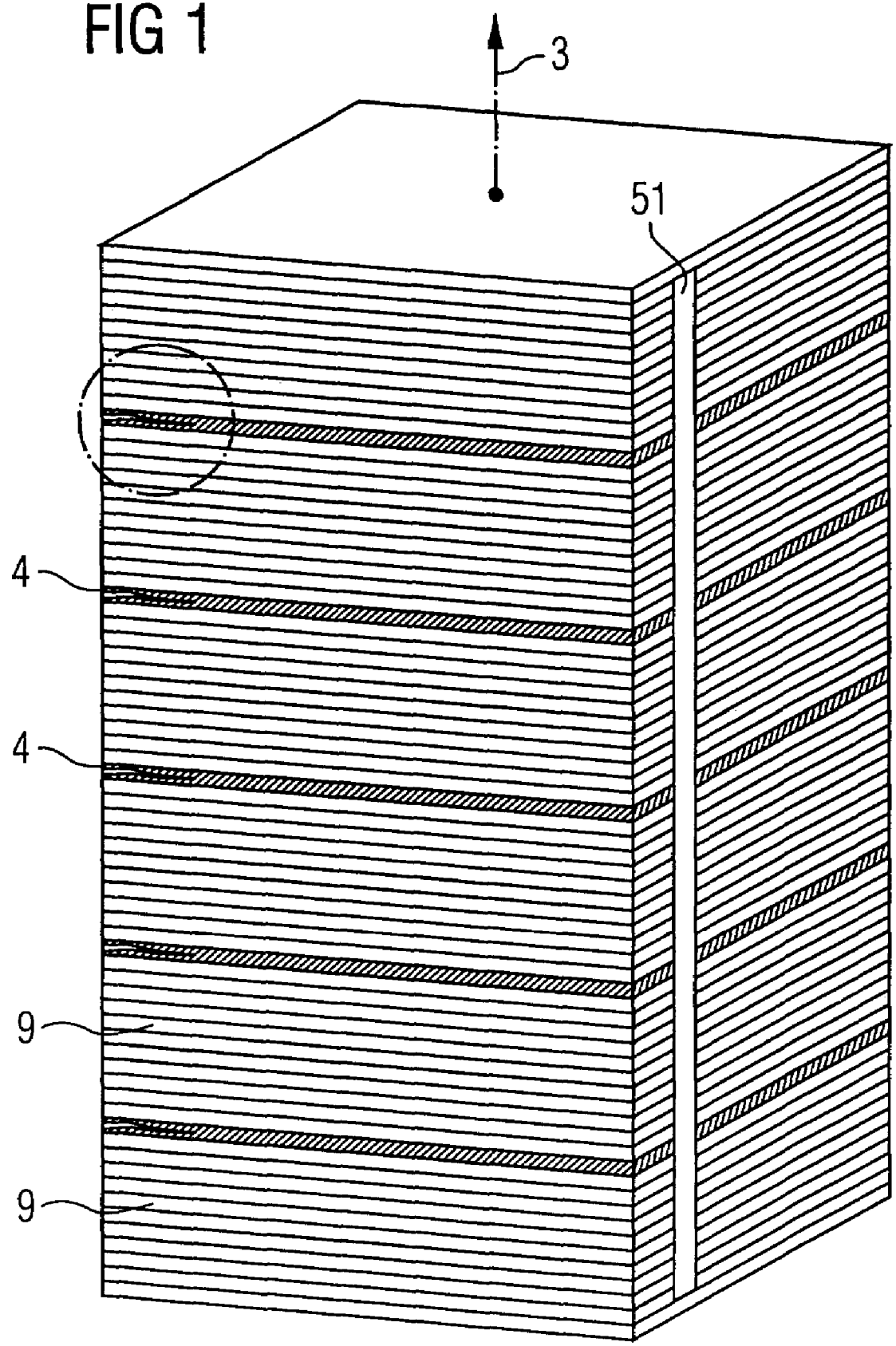
FIG. 1 is a perspective view of an exemplary multilayer component according to the invention.
Figure 2:
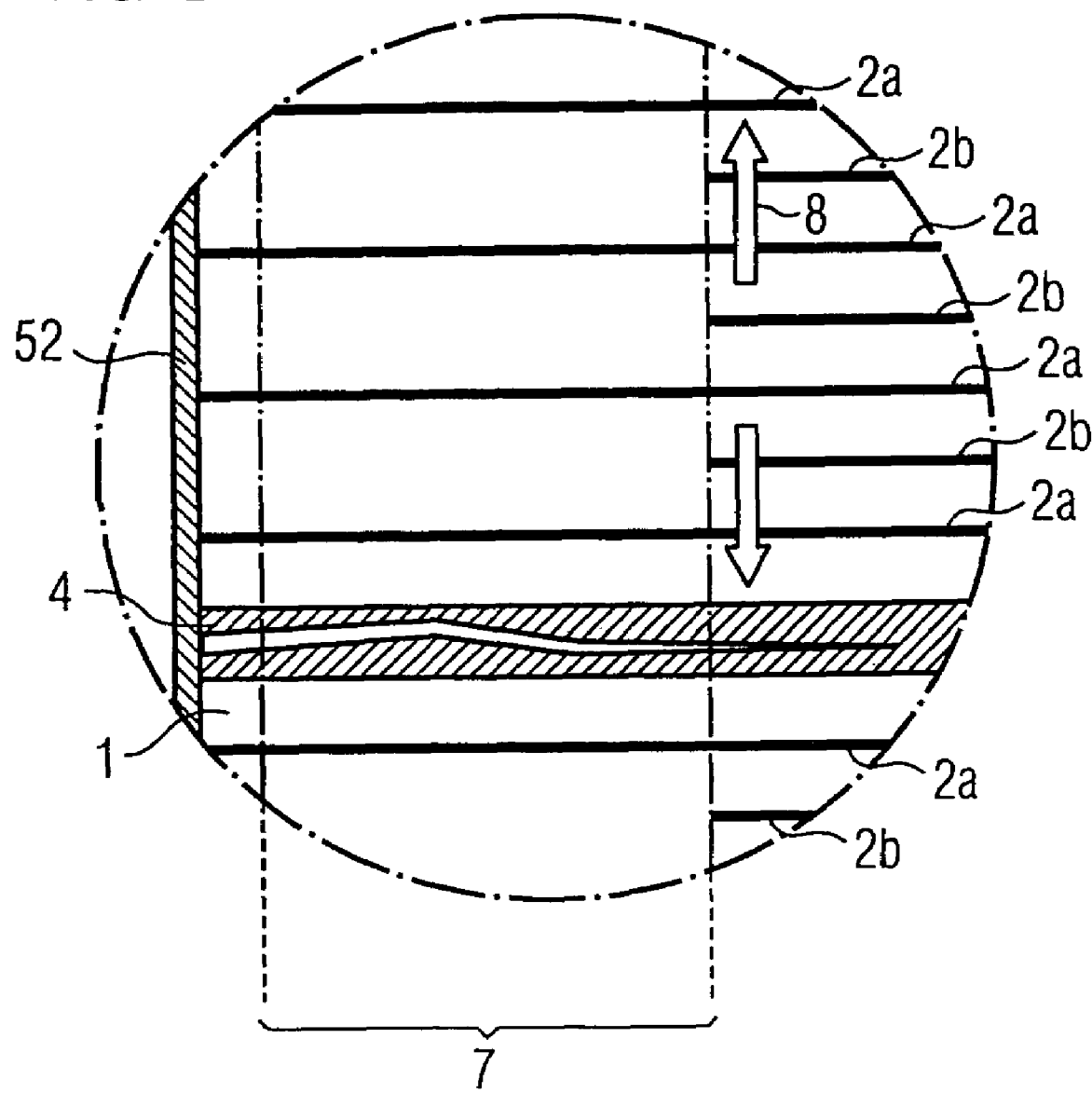
FIG. 2 is a longitudinal section through a partial zone of the component of FIG. 1.

FIGS. 1 and 2 show a piezoelectric actuator in which a plurality of ceramic layers 1 are arranged one on top of the other along a lengthwise axis 3. A PZT ceramic, for example having a composition $Pb_{0.96}Cu_{0.02}Nd_{0.02}(Zr_{0.54}Ti_{0.46})O_3$ may particularly be used as the ceramic material for ceramic layers 1.

In addition, electrode layers 2a, 2b are provided, each of which is arranged between two adjacent ceramic layers 1. Electrode layers 2a belong to one electrical pole of the component and electrode layers 2b belong to the other electrical pole of the component. Electrode layers 2b are extend as far as the extreme right edge of the component and are connected to each other in electrically conductive manner via external contact 51, wherein at the same time external contact 51 enables a pole of an electrical voltage source to be applied.

In the same way, electrode layers 2a, which extend to the outer edge of the component on the left side, are connected in electrically conductive manner to an external contact 52, on the left side of the component (not shown in FIG. 1). The other pole of the electrical voltage source may be connected to external contact 52.

Electrode layers 2a and 2b do not overlap in the region of a passive zone 7, only electrode layers of the same sort, for example electrode layers 2a (see FIG. 2) are present in passive zone 7. To prevent the tensile stresses that occur at the inner edge of passive zone 7—indicated by arrows 8—from extending uncontrollably into the interior of the piezoactuator, designed breach layers 4 are provided at intervals along lengthwise axis 3 of the piezoactuator, which layers have a greater porosity than ceramic layers 1. Cracks 6 may propagate particularly easily along the pores in designed breach layers 4, so that a certain channelling or guidance of cracks 6 along designed breach layers 4 is obtained. Accordingly, the risk is minimised that the crack 6 might turn upwards or downwards as soon as it occurs in a designed breach layer, which it would otherwise tend to do, damaging one of electrode layers 2a or 2b by breaking it through.

In order to avoid the generation of an electrical field across the breach layers 4 during operation of the piezoactuator, it is provided to assign the same electrical polarity of the piezoactuator to the electrode layers 2a immediately adjacent designed breach layer 4, as is shown in FIG. 2.

Designed breach layers 4 should be distributed along longitudinal axis 3 in such manner that partial actuators 9 are formed, whose height is severely limited, such that the tensile stresses occurring during normal operation or polarization of the piezoactuator are no longer able to cause cracks in the actuator.

For example it may be provided that a 30 mm high piezoactuator is divided into 10 partial actuators 9 by means of nine designed breach layers 4, each partial actuator being 3 mm high. In one embodiment of the invention, this height of 3 mm corresponds to a number of 37 ceramic layers 1.

A mixture of silver and palladium such as is suitable for joint sintering with piezoactive ceramic layers, may be used as the material for electrode layers 2a, 2b. However, other electrode layers containing copper or even made entirely of copper are also conceivable.

The piezoactuator as represented in FIGS. 1 and 2 may be manufactured by means of a layer stack, which essentially resembles the component represented in FIGS. 1 and 2, although in this case no external contacts 51, 52 and no cracks 6 are yet present. Otherwise, the construction of the ceramic layers, the electrode layers, and the designed breach layers corresponds to the construction of a layer stack, wherein the ceramic layers are produced in a preform as ceramic green films containing a ceramic powder and an organic binder. The electrode layers are available as pastes containing metal powder. The designed breach layers have the form of green films in the same way as the ceramic layers, though here the content of organic binder in the layers that are to be conditioned subsequently as designed breach layers is increased with respect to the other ceramic layers. For example, green films may be used for the ceramic layers in which a volumetric content of 30% is taken up by organic binder. To increase the volumetric content in specific layers of the layer stack, this may be increased to a volumetric content of 50 to 60%. With such a volumetric content of organic binder, there are also no problems with agglomeration of the ceramic powder, which prevents further drawing of defined films, when the film is drawn.

The component is produced by joint sintering of the layers present in the layer stack. This is done in a single process step.

It should also be noted that the previously described electrical multilayer component is not limited to the ceramic material described herein. Any type of ceramic material that has a piezoelectric effect is conceivable. In addition, the component is not limited to piezoactuators.

Any type of ceramic material that has an electrical function is conceivable. In particular, the component is capable of being used wherever such a component is exposed to tensile stresses in the longitudinal direction.

The invention claimed is:

1. A multilayer electrical component, comprising:
a plurality of ceramic layers disposed along an axis,
a plurality of electrode layers disposed among the plurality of ceramic layers, and
a ceramic breach layer disposed between a first and a second ceramic layer of the plurality of ceramic layers along the axis, the ceramic breach layer having a lower breach stability than the plurality of ceramic layers with regard to tensile stresses in the direction of the axis.

2. The component of claim 1, wherein the breach layer comprises a material having a greater porosity than the plurality of ceramic layers.

3. The component of claim 1, wherein the mutilayer electrical component comprises a monolithic component.

4. The component of claim 1, further comprising a plurality of breach layers disposed at multiple points along the axis.

5. The component of claim 1, wherein the plurality of electrode layers includes a first and a second electrode layer adjacent to the ceramic breach layer, the first and second electrode layers having an electrical polarity that is the same as one of the electrical polarities of the component.

6. The component of claim 1, wherein a porosity of the breach layer is between about 1.2 and about 3 times greater than the porosity of the ceramic layers.

7. The component of claim 1, wherein the breach layer comprises the same ceramic material as the ceramic layers.

8. The component of claim 1, wherein the component comprises a piezoelectric actuator.

9. A layer stack, comprising:
a plurality of ceramic green films disposed in a stack, the plurality of ceramic green films comprising:
a ceramic powder, and
an organic bonding agent,
wherein at least one of the green films of the plurality of green films has an increased volumetric content of bonding agent compared to the other green films.

10. The layer stack of claim 9, wherein the volumetric content of bonding agent in the at least one of the green films is increased by a factor of about 1.5 to about 3 times the volumetric content of bonding agent of at least some of the other green films.

* * * * *